(12) United States Patent
Leobandung

(10) Patent No.: US 10,892,164 B2
(45) Date of Patent: Jan. 12, 2021

(54) DUAL HARD MASK REPLACEMENT GATE

(71) Applicant: INTERNATIONAL BUSINESS MACHINES CORPORATION, Armonk, NY (US)

(72) Inventor: Effendi Leobandung, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/385,248

(22) Filed: Apr. 16, 2019

(65) Prior Publication Data
US 2020/0335336 A1 Oct. 22, 2020

(51) Int. Cl.
*H01L 21/033* (2006.01)
*H01L 29/423* (2006.01)
*H01L 29/66* (2006.01)
*H01L 29/40* (2006.01)

(52) U.S. Cl.
CPC ........ *H01L 21/0332* (2013.01); *H01L 29/401* (2013.01); *H01L 29/4232* (2013.01); *H01L 29/66545* (2013.01)

(58) Field of Classification Search
CPC .......... H01L 21/0332; H01L 29/66545; H01L 29/401
See application file for complete search history.

(56) References Cited

U.S. PATENT DOCUMENTS

| | | | |
|---|---|---|---|
| 7,419,898 B2 | 9/2008 | Liaw | |
| 8,084,325 B2 | 12/2011 | Kim | |
| 9,054,178 B2 | 6/2015 | Bohr et al. | |
| 9,064,801 B1 | 6/2015 | Horak et al. | |
| 9,076,816 B2 | 7/2015 | Zhang et al. | |
| 9,257,529 B2 | 2/2016 | Metz | |
| 9,570,583 B2 | 2/2017 | Cai et al. | |
| 9,679,991 B2 | 6/2017 | Jun et al. | |
| 9,859,386 B2 | 1/2018 | Ho et al. | |
| 10,141,226 B2 | 11/2018 | Bohr et al. | |
| 10,319,832 B2* | 6/2019 | Li | H01L 21/823481 |
| 2013/0092986 A1* | 4/2013 | Wang | H01L 21/823864 257/288 |
| 2020/0135912 A1* | 4/2020 | Tsai | H01L 21/02362 |

* cited by examiner

*Primary Examiner* — Hsien Ming Lee
(74) *Attorney, Agent, or Firm* — Cantor Colburn LLP; Robert Sullivan

(57) ABSTRACT

A method of fabricating a semiconductor device includes depositing a first hard mask layer on a recessed gate stack arranged between gate spacers. The method further includes depositing a second hard mask layer on the first hard mask layer between the gate spacers.

19 Claims, 12 Drawing Sheets

DUAL HARD MASK REPLACEMENT GATE

BACKGROUND

The present invention generally relates to fabrication methods and resulting structures for semiconductor devices. More specifically, the present invention relates to methods and resulting structures for semiconductor devices with dual hard mask replacement gates.

In an integrated circuit, each metal oxide semiconductor field effect transistor (MOSFET) has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. An interlayer dielectric (ILD) is typically formed over the MOSFET and covers the gate electrode and source and drain regions. Electrical connections are made to the MOSFET via contact plugs that are typically formed of a metal, such as tungsten. The contact plugs are fabricated by first patterning the ILD layer to form vias down to the source and drain regions. Then a metal is deposited in the vias to form the contact plugs.

Complementary metal oxide semiconductor (CMOS) is a technology that uses complementary and symmetrical pairs of p-type and n-type MOSFETs to implement logic functions. The electrical current flow is induced in the channel region by a voltage applied at the gate electrode.

SUMMARY

Embodiments of the present invention are directed to a method for fabricating a semiconductor device. A non-limiting example of the method includes depositing a first hard mask layer on a recessed gate stack arranged between gate spacers. The method further includes depositing a second hard mask layer on the first hard mask layer between the gate spacers.

Another non-limiting example of the method includes replacing a sacrificial gate material arranged between a pair of gate spacers with a metal gate stack. The method also includes depositing a first hard mask layer on a recessed gate stack arranged between the pair of gate spacers. The method also includes depositing a second hard mask layer on the first hard mask layer between the gate spacers.

Embodiments of the present invention are directed to a semiconductor device. A non-limiting example of the semiconductor device includes a first hard mask layer arranged on a recessed gate stack. The semiconductor device also includes a second hard mask layer arranged on the first hard mask layer. The semiconductor device further includes a pair of gate spacers arranged on sidewalls of the recessed gate stack, the first hard mask layer, and the second hard mask layer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1-12 depict a process flow for fabricating a semiconductor device according to embodiments of the present invention, in which:

FIG. 1 depicts a cross-sectional side view of the semiconductor device subsequent to forming gates and source/drain regions formed on a substrate;

FIG. 2 depicts a cross-sectional side view of the semiconductor device subsequent to depositing and planarizing an ILD layer;

FIG. 3 depicts a cross-sectional side view of the semiconductor device subsequent to removing sacrificial gate material from the gates;

FIG. 4 depicts a cross-sectional side view of the semiconductor device subsequent to depositing a gate dielectric in the gate area;

FIG. 5 depicts a cross-sectional side view of the semiconductor device subsequent to depositing a gate metal on the gate dielectric;

FIG. 6 depicts a cross-sectional side view of the semiconductor device subsequent to recessing the gate metal and the gate dielectric;

FIG. 7 depicts a cross-sectional side view of the semiconductor device subsequent to depositing a first hard mask layer on the recessed gate metal and gate dielectric;

FIG. 8 depicts a cross-sectional side view of the semiconductor device subsequent to recessing the first hard mask layer;

FIG. 9 depicts a cross-sectional side view of the semiconductor device subsequent to depositing a second hard mask layer on the recessed first hard mask layer;

FIG. 10 depicts a cross-sectional side view of the semiconductor device subsequent to forming a contacts to the source/drain regions;

FIG. 11 depicts a cross-sectional side view of the semiconductor device subsequent to depositing an ILD; and FIG. 12 depicts a cross-sectional side view of the semiconductor device subsequent to forming contacts in the ILD.

Figure 1:
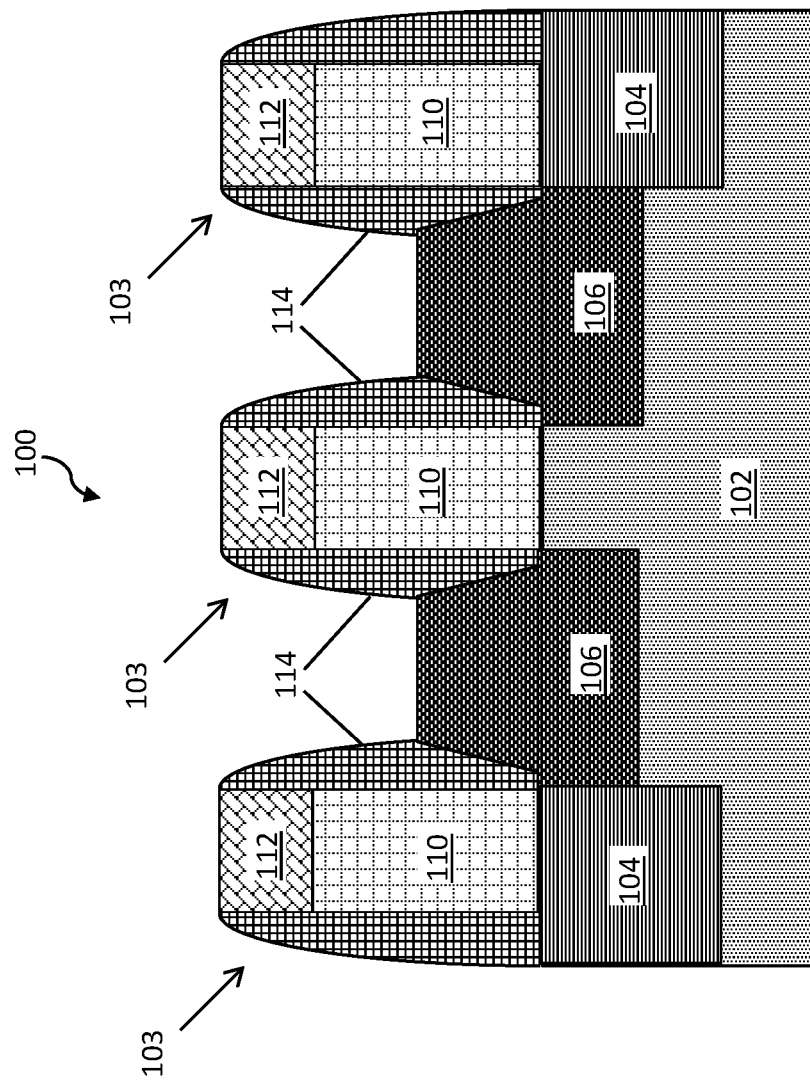

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, one challenge that can occur during the fabrication of a contact to a source/drain is the formation of a contact-to-gate short. A contact-to-gate short is a short circuit that occurs when the contact plug is misaligned and comes into electrical contact with the gate electrode. Such a short can occur, for example, when a void forms in the gate electrode hard mask. The void can expose the gate electrode, which allows metal from the contact to come into electrical contact with the gate electrode and cause a short circuit. These challenges are exacerbated as the transistor gate pitch dimensions are scaled down because the critical dimensions become much smaller.

Turning now to an overview of the aspects of the invention, one or more embodiments of the invention address the above-described shortcomings of the prior art by providing methods and resulting structures for semiconductor devices including dual hard mask protective caps over the gate electrode. A first hard mask is deposited on the gate electrode and recessed, and a second hard mask is deposited on the first recessed hard mask. An ILD is deposited on the dual hard masks, and contacts are formed to the source/drain regions.

The above-described aspects of the invention address the shortcomings of the prior art by using two hard mask layers to form a protective cap on the gate electrode, which will not form shorts to the gate electrode should contact misalignment occur. Any void that forms in the first hard mask layer in contact with the gate electrode will be covered and protected by the second hard mask layer.

Turning now to a more detailed description of aspects of the present invention, FIGS. 1-12 depict a process flow for fabricating a semiconductor device according to embodiments of the present invention. FIG. 1 depicts a cross-sectional side view of the semiconductor device 100 subsequent to forming gates 103 and source/drain regions 106 formed on a substrate 102. Although the device shown on FIG. 1 is a planar device, the devices according to embodiments of the present invention can be a FINFET, gate-all-around device (GAA), bipolar transistor, or diode.

The substrate 102 includes one or more semiconductor materials. Non-limiting examples of suitable substrate materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof.

Isolations regions 104 are formed in the substrate 102. The isolation regions 104 are formed by any known method in the art, including, for example, lithography or etching to form trenches, and then filling the trenches with an insulating material, such as silicon dioxide. After forming isolation regions 104, an "active area" is defined as the region between a pair of isolation regions 104. At least one isolation region is a shallow trench isolation region ("STI"). However, the isolation region 104 can be a trench isolation region, a field oxide isolation region, or any other equivalent known in the art. The isolation regions 104 provide isolation between neighboring gate structure regions, and can be used when the neighboring gates have opposite conductivities, i.e., nFETs and pFETs. As such, the at least one isolation region 104 can separate an nFET device region from a pFET device region.

Source/drain regions 106 are the active regions or areas between the isolation regions 104. The source/drain regions 106 can be formed by incorporating dopants into the substrate 102. The dopant can be an n-type dopant (e.g., phosphorus or arsenic) or a p-type dopant (e.g., boron or gallium). The source/drain regions 106 also can be formed by using an epitaxial growth process to deposit a crystalline layer (an epitaxial layer) onto the crystalline substrate 102. Epitaxial growth can be grown using vapor-phase epitaxy (VPE), molecular-beam epitaxy (MBE), liquid-phase epitaxy (LPE), or other suitable process. The epitaxial growth material can then be doped with an n-type dopant or a p-type dopant.

Gates 103 are formed on the substrate 102. The gates are 103 "dummy" gates and include a sacrificial material 110 surrounded by gate spacers 114 and a hard mask cap 112. Non-limiting examples of sacrificial material 110 include amorphous silicon (aSi) or polycrystalline silicon (polysilicon). The sacrificial material 110 is deposited by a deposition process, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof.

An insulating hard mask layer, for example, silicon nitride (SiN), SiOCN, or SiBCN is deposited on the sacrificial material 110 to form the hard mask caps 112. The hard mask layer is deposited using a deposition process, including, but not limited to, PVD, CVD, PECVD, or any combination thereof. The sacrificial material 110 and hard mask layer are patterned and etched to form the gates 103.

To form the gate spacers 114, an insulating material, for example, silicon dioxide, silicon nitride, SiOCN, or SiBCN is deposited on the hard mask cap 112. Other non-limiting examples of materials for the gates spacers 114 include dielectric oxides (e.g., silicon oxide), dielectric nitrides (e.g., silicon nitride), dielectric oxynitrides, or any combination thereof. An anisotropic etch process, for example, reactive ion etch (RIE), is performed to form gate spacers 114 on sidewalls of the sacrificial material 110 of the gates 103.

Figure 2:
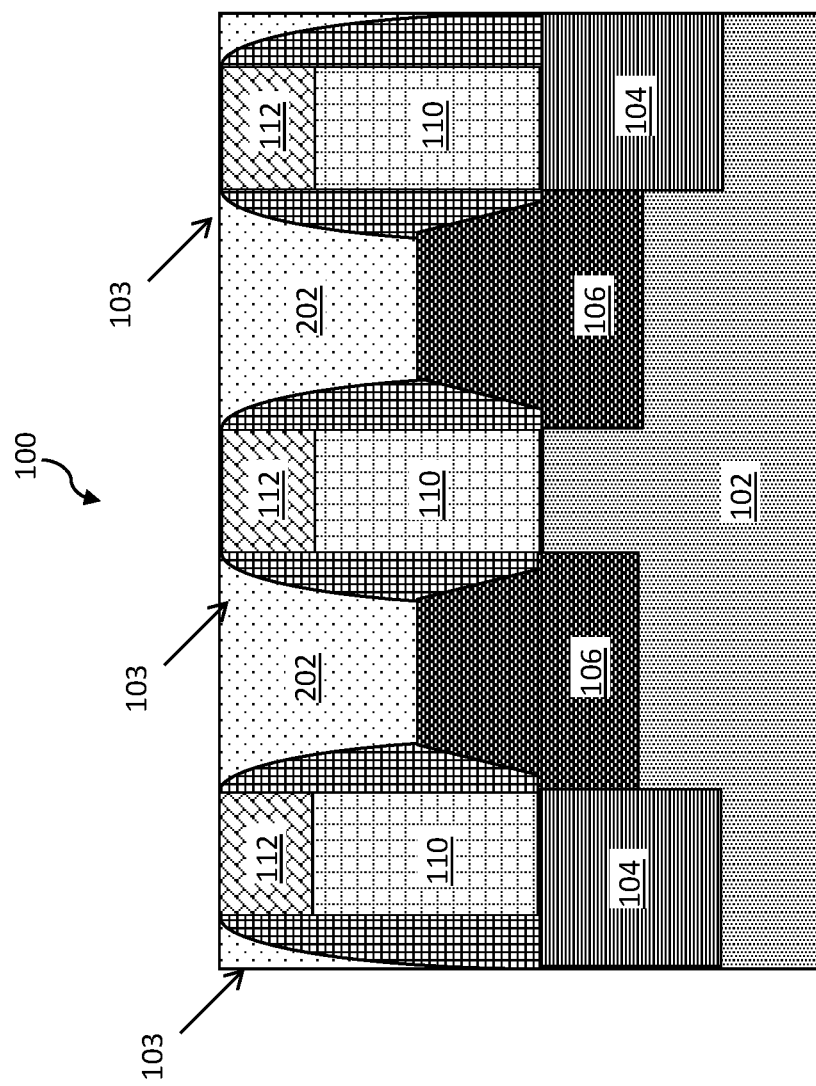

FIG. 2 depicts a cross-sectional side view of the semiconductor device 100 subsequent to depositing and planarizing an ILD 202. The ILD 202 is deposited on the gates 103 and includes, for example, a dielectric material, such as a low-k material. The dielectric material can be, but not limited to, silicon oxide, spin-on-glass, a flowable oxide, a high density plasma oxide, borophosphosilicate glass (BPSG), or any combination thereof. The dielectric material is deposited by a deposition process, including, but not limited to CVD, PVD, plasma enhanced CVD, atomic layer deposition (ALD), evaporation, chemical solution deposition, or like processes. The ILD 202 is planarized or polished, by for example chemical mechanical planarization (CMP), to the top surface of the gates 103.

Figure 3:
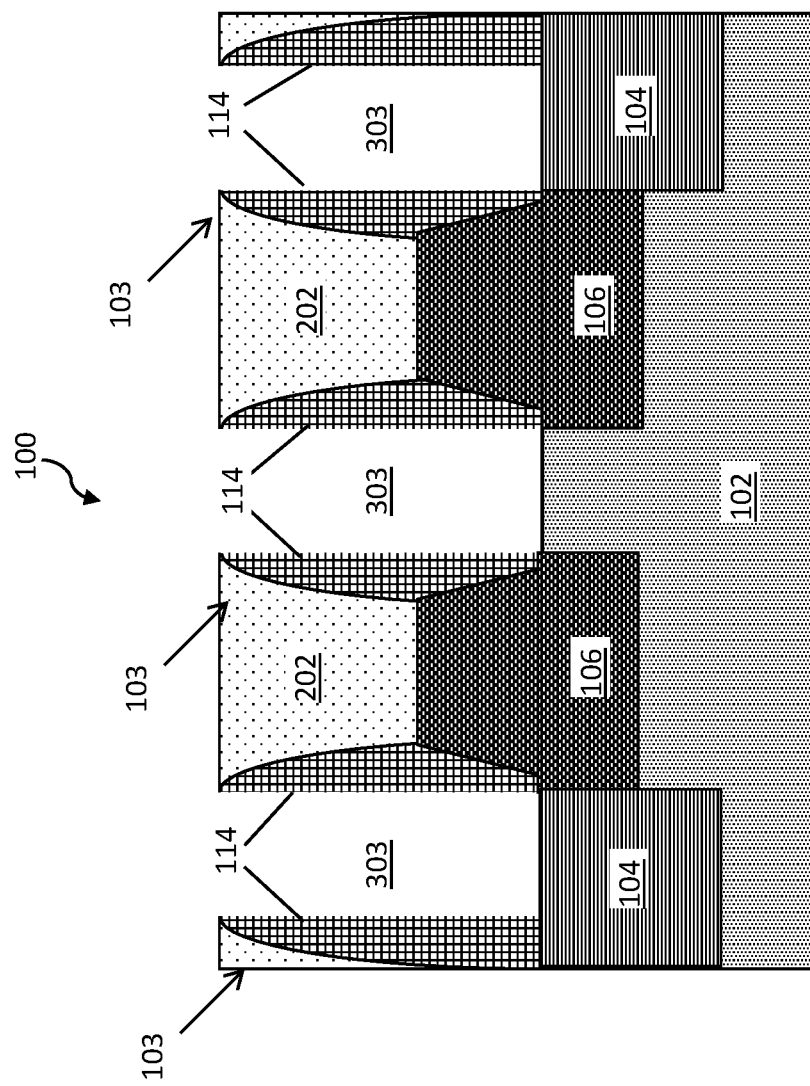

FIG. 3 depicts a cross-sectional side view of the semiconductor device 100 subsequent to removing the hard mask cap 112 and the sacrificial gate material 110 from the gates 103. The hard mask cap 112 and the sacrificial material 110 are removed by one or more etch processes, and such that the isolation regions 104 in the substrate 102 beneath the gates 103 are exposed. Openings 303 are formed between the gate spacers 114.

Figure 4:
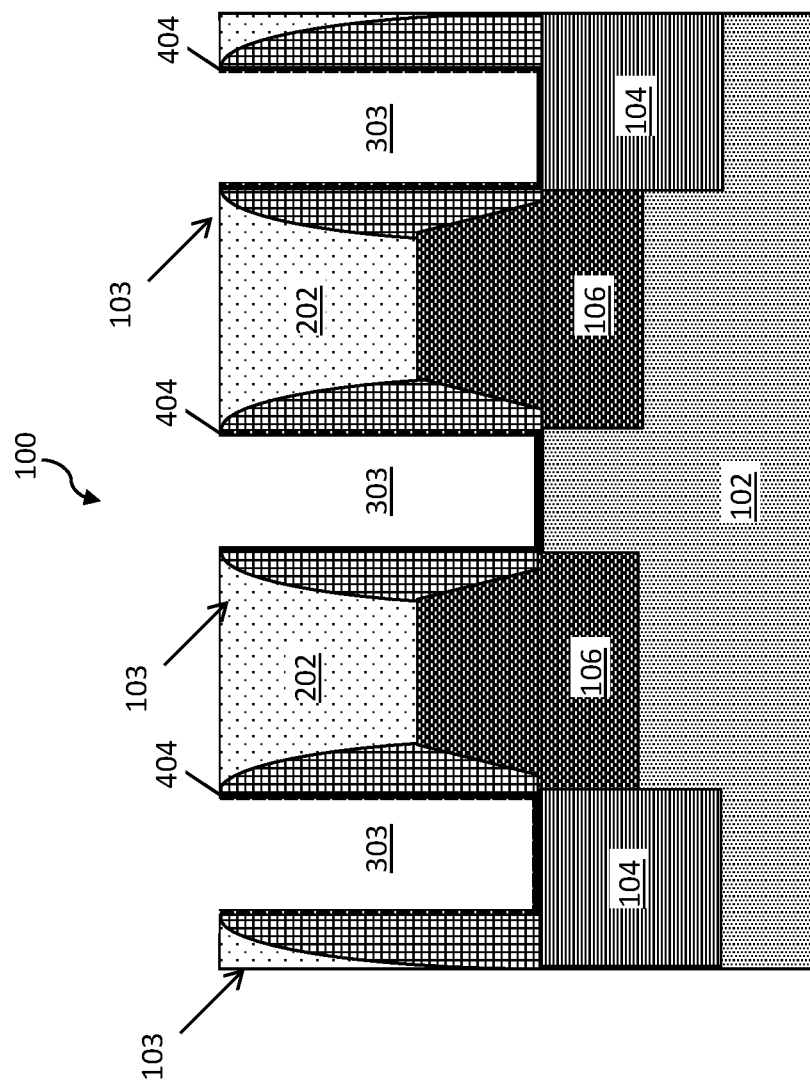

FIG. 4 depicts a cross-sectional side view of the semiconductor device 100 subsequent to depositing a gate dielectric 404 in the openings 303 of the gate area between the gate spacers 114. The gate dielectric 404 lines sidewalls of the gate spacers 114 and the surface of the isolation regions 104.

The gate dielectric 404 includes one or more dielectric materials. Non-limiting examples of suitable materials for the gate dielectric 404 include oxides, nitrides, oxynitrides, silicates (e.g., metal silicates), aluminates, titanates, nitrides, or any combination thereof. Examples of high-k materials for the gate dielectric 404 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric 404 is formed by a deposition processes, for example, CVD, PECVD, ALD, evaporation, PVD, chemical solution deposition, or other like processes. The thickness of the dielectric material can vary depending on the deposition process as well as the composition and number of dielectric materials used.

Figure 5:
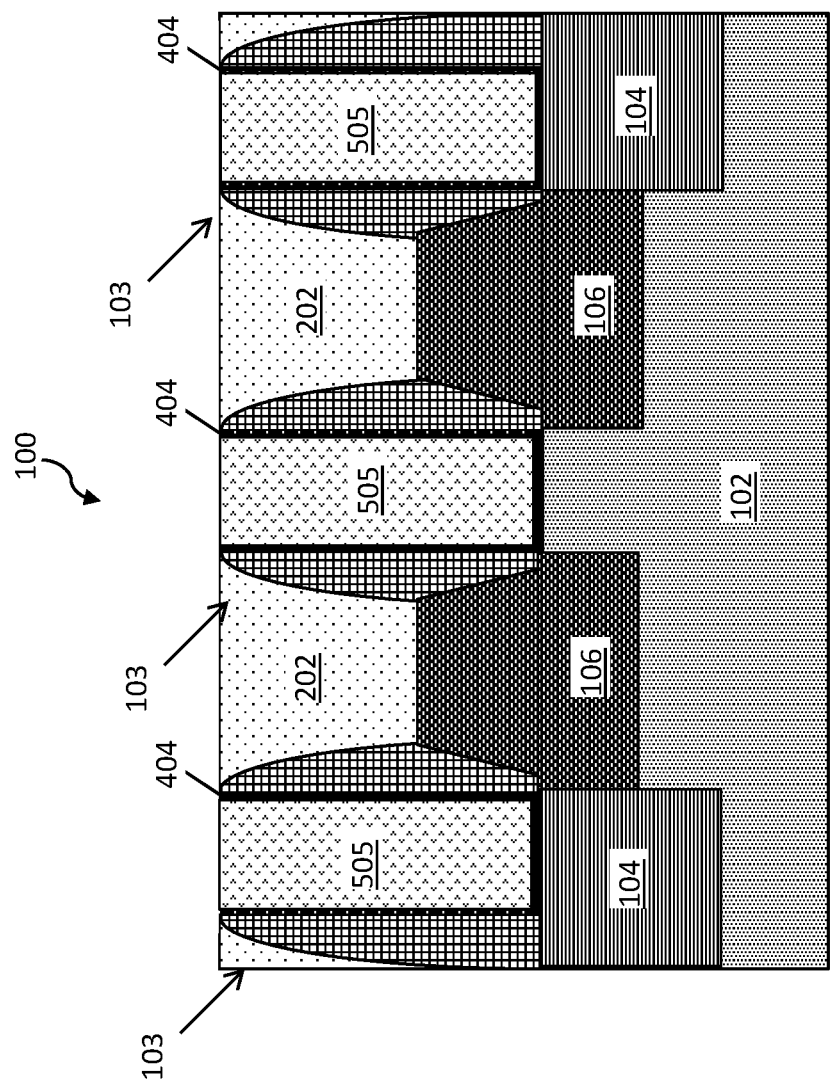

FIG. 5 depicts a cross-sectional side view of the semiconductor device 100 subsequent to depositing one or more layers of a gate metal 505 on the gate dielectric 404. The one or more layers of gate metal 505 fills the opening between the gate spacers 114 and forms metal gates. The one or more layers of gate metal 505 includes one or more work function metals and one or more conductive gate metals.

The work function metal(s) are disposed over the gate dielectric 404. The type of work function metal(s) depends on the type of transistor. Non-limiting examples of work function metals include p-type work function metal materials and n-type work function metal materials. P-type work function materials include, for example, titanium nitride, ruthenium, palladium, platinum, cobalt, nickel, and conductive metal oxides, or any combination thereof. N-type metal materials include, for example, hafnium, zirconium, titanium, titanium nitride, tantalum, aluminum, metal carbides (e.g., hafnium carbide, zirconium carbide, titanium carbide, and aluminum carbide), aluminides, or any combination thereof. The work function metal(s) are be deposited by a suitable deposition process, for example, CVD, PECVD, PVD, plating, thermal or e-beam evaporation, and sputtering.

The conductive gate metal is deposited over the gate dielectric 404 and workfunction layer(s) to form metal gate stacks. Non-limiting examples of conductive metals include aluminum (Al), platinum (Pt), gold (Au), tungsten (W), titanium (Ti), or any combination thereof. The conductive metal is be deposited by a suitable deposition process, for example, CVD, PECVD, PVD, plating, thermal or e-beam evaporation, and sputtering. A planarization process, for example, CMP is performed to polish the surface of the conductive gate metal.

Figure 6:
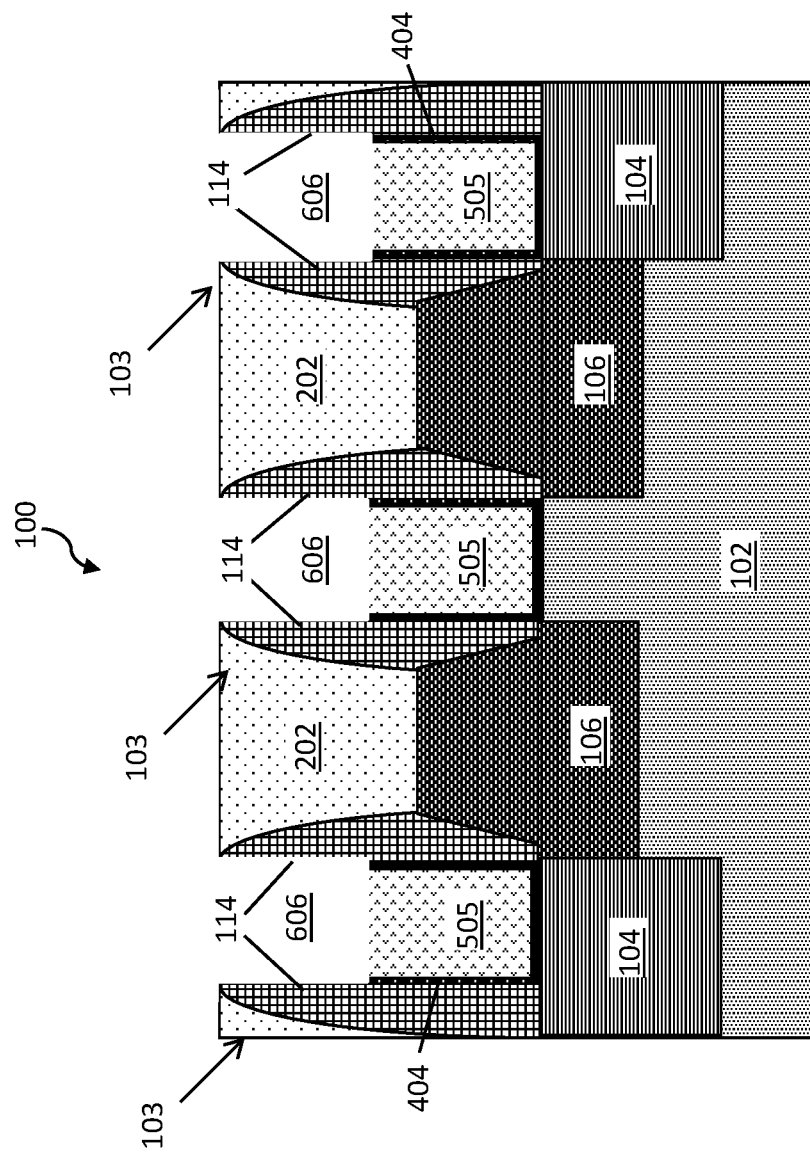

FIG. 6 depicts a cross-sectional side view of the semiconductor device 100 subsequent to recessing the gate metal 505 and the gate dielectric 404. Portions of the gate dielectric 404 and gate metal 505 are removed by one or more etch processes to form openings 606 between the gate spacers 114 over the recessed gate metal 505 and gate dielectric 404.

Figure 7:
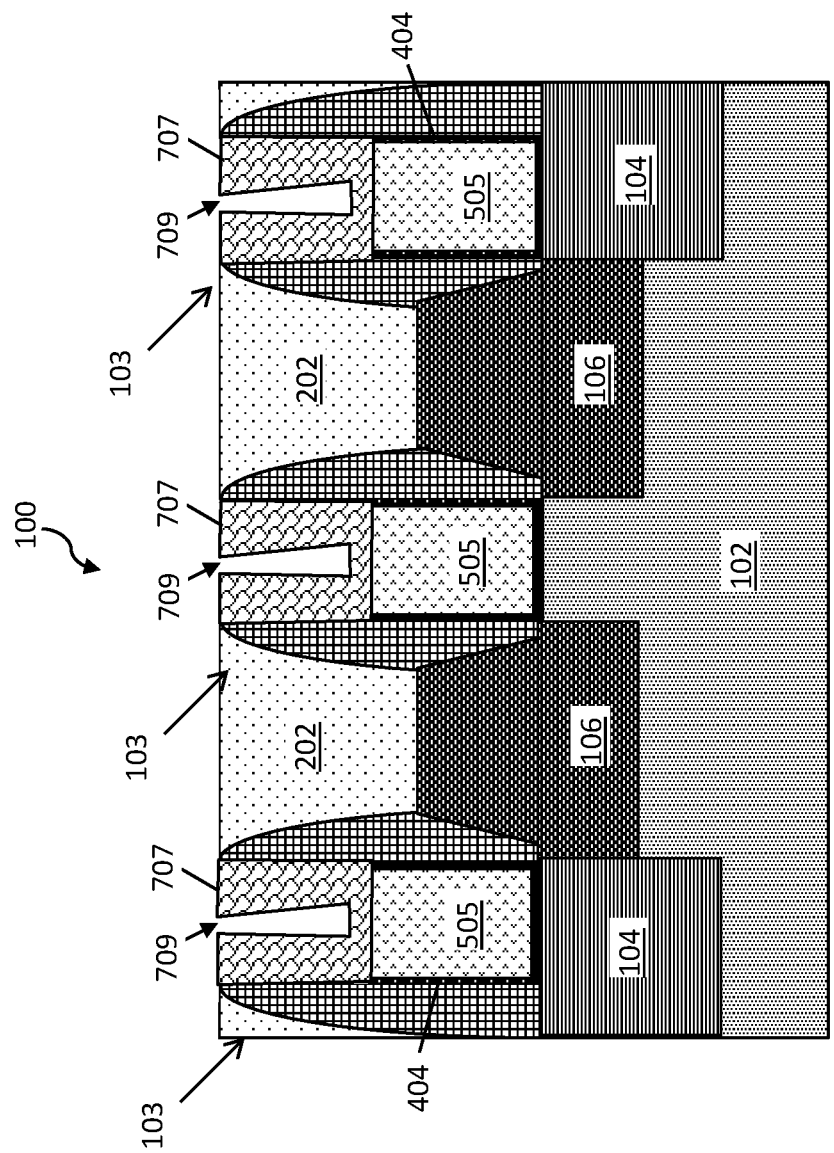

FIG. 7 depicts a cross-sectional side view of the semiconductor device 100 subsequent to depositing a first hard mask layer 707 in the opening 606 on the recessed gate metal 505 and gate dielectric 404. The first hard mask layer 707 fills the openings between the gate spacers 114. The first hard mask layer 707 is a low-k dielectric material that is porous and easily etched. Non-limiting examples of low-k dielectric materials for the first hard mask layer 707 include silicon carbon (SiCOH), boron nitride, amorphous carbon, or any combination thereof. The first hard mask layer 707 is planarized, for example by CMP, after deposition. The first hard mask layer 707 can form a void 709 within the material. A void 709 can form within the material due to the high aspect ratio (i.e., ratio of width to height) of the opening 606.

Figure 8:
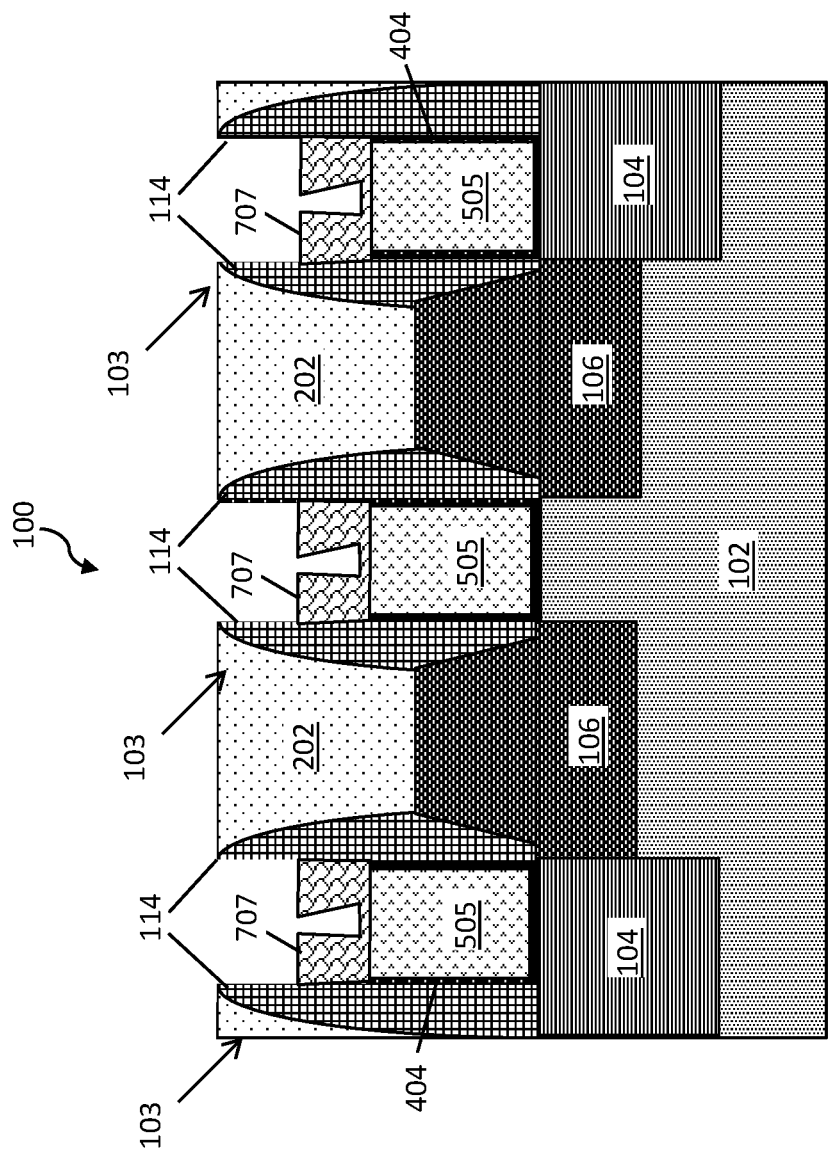

FIG. 8 depicts a cross-sectional side view of the semiconductor device 100 subsequent to recessing the first hard mask layer 707. The first hard mask layer 707 is recessed to form openings between the gate spacers 114.

Figure 9:
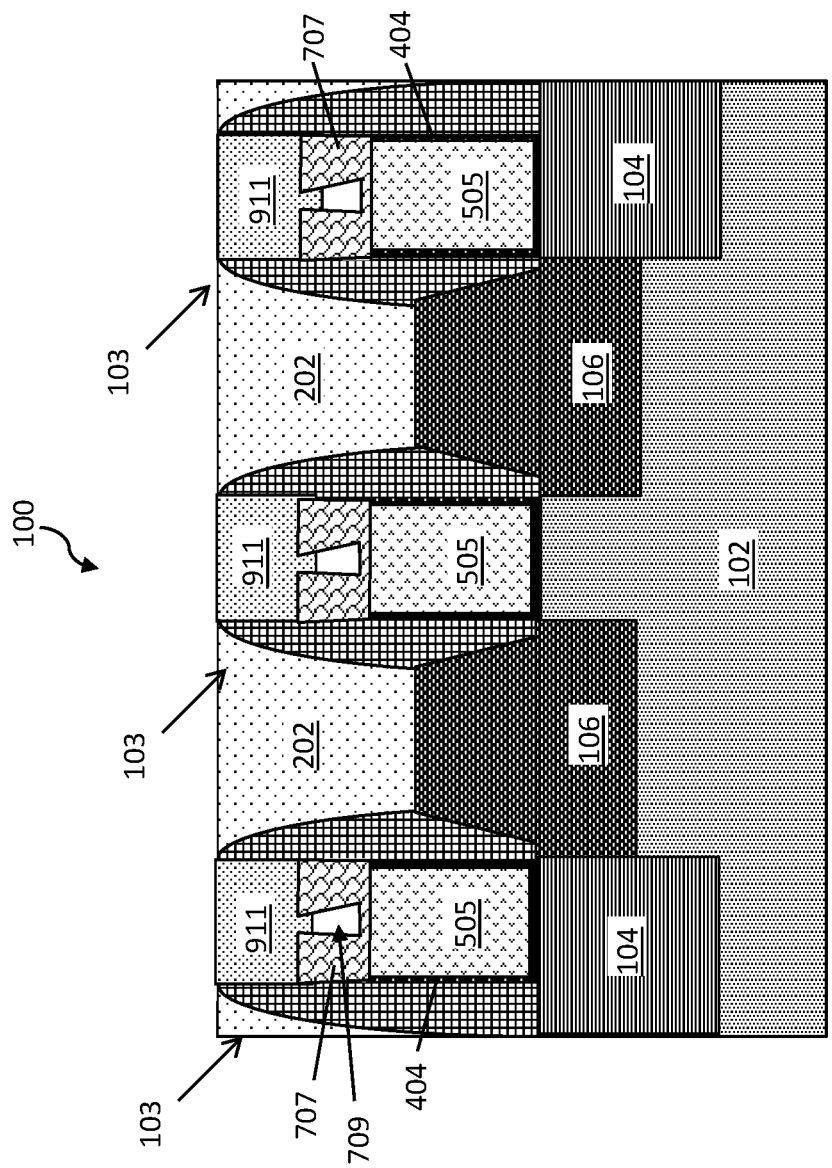

FIG. 9 depicts a cross-sectional side view of the semiconductor device 100 subsequent to depositing a second hard mask layer 911 on the recessed first hard mask layer 707. The second hard mask layer 911 will fill or partially fill any void 709 (also referred to as an airgap) formed or remaining in the first hard mask layer 707. The second hard mask layer 911 is a material that is more etch resistant than the first hard mask layer 707. According to some embodiments, the second hard mask layer 911 includes a different material than the first hard mask layer 707. According to other embodiments, the second hard mask layer 911 is the same material as the first hard mask layer 707. Non-limiting examples of materials for the second hard mask layer 911 include hafnium oxide, boron nitride, or any combination thereof. The second hard mask layer 909 is planarized. No voids are formed in the second hard mask layer 911 because the aspect ratio is smaller. Also, the gate parasitic cap to contact is lower because there is a void 709 between eventual source drain contact to the gate.

Figure 10:
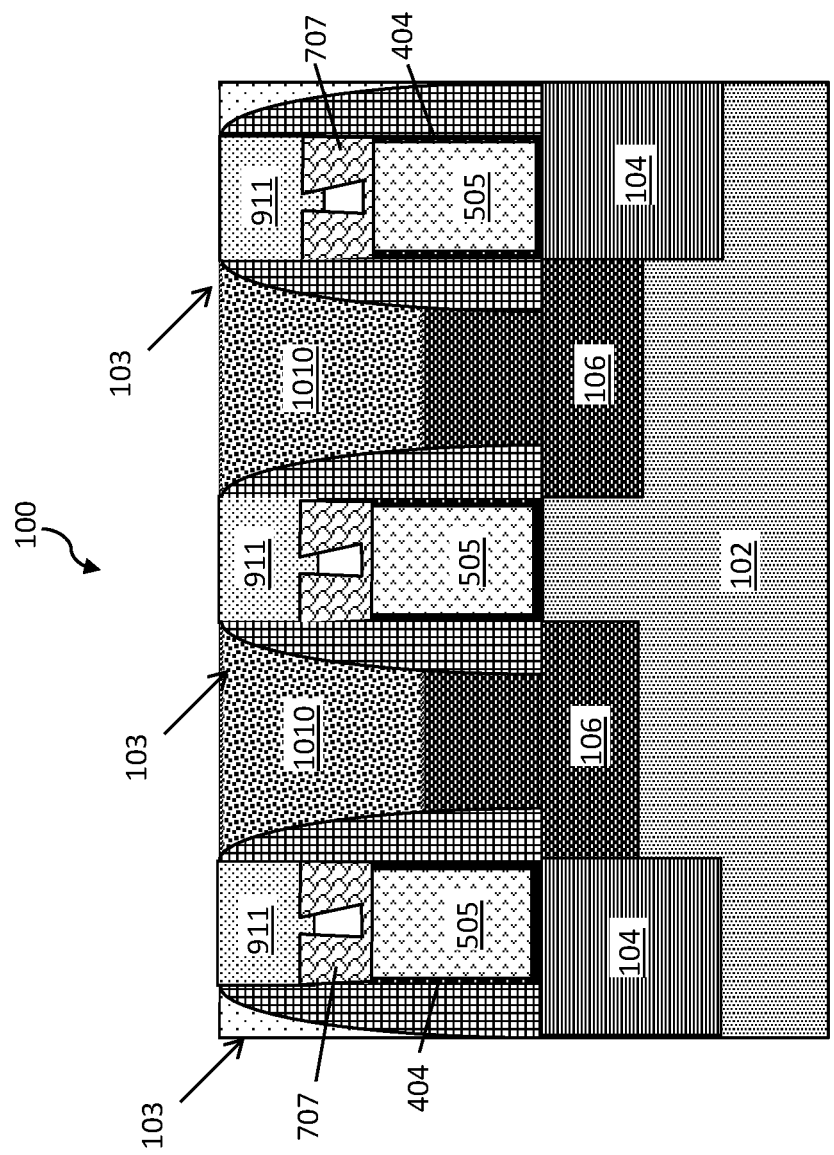

FIG. 10 depicts a cross-sectional side view of the semiconductor device 100 subsequent to forming a contacts 1010 to the source/drain regions 106. The contacts 1010 are also referred to as the first portion of source/drain contacts. The ILD 202 is removed from the region between the gates 103 and down to the level of the source/drain regions 106. A silicide is formed in the openings to form the contacts 1010. To form the silicide, a metallic film is deposited, for example by performing an evaporation process or a sputtering process. The metallic film is annealed, for example, by heating inside a furnace or performing a rapid thermal treatment in an atmosphere containing pure inert gases. Non-limiting examples of metal silicide materials for the contacts 1010 include titanium silicide, tungsten silicide, cobalt silicide, nickel silicide, molybdenum silicide, platinum silicide, or any combination thereof.

Figure 11:
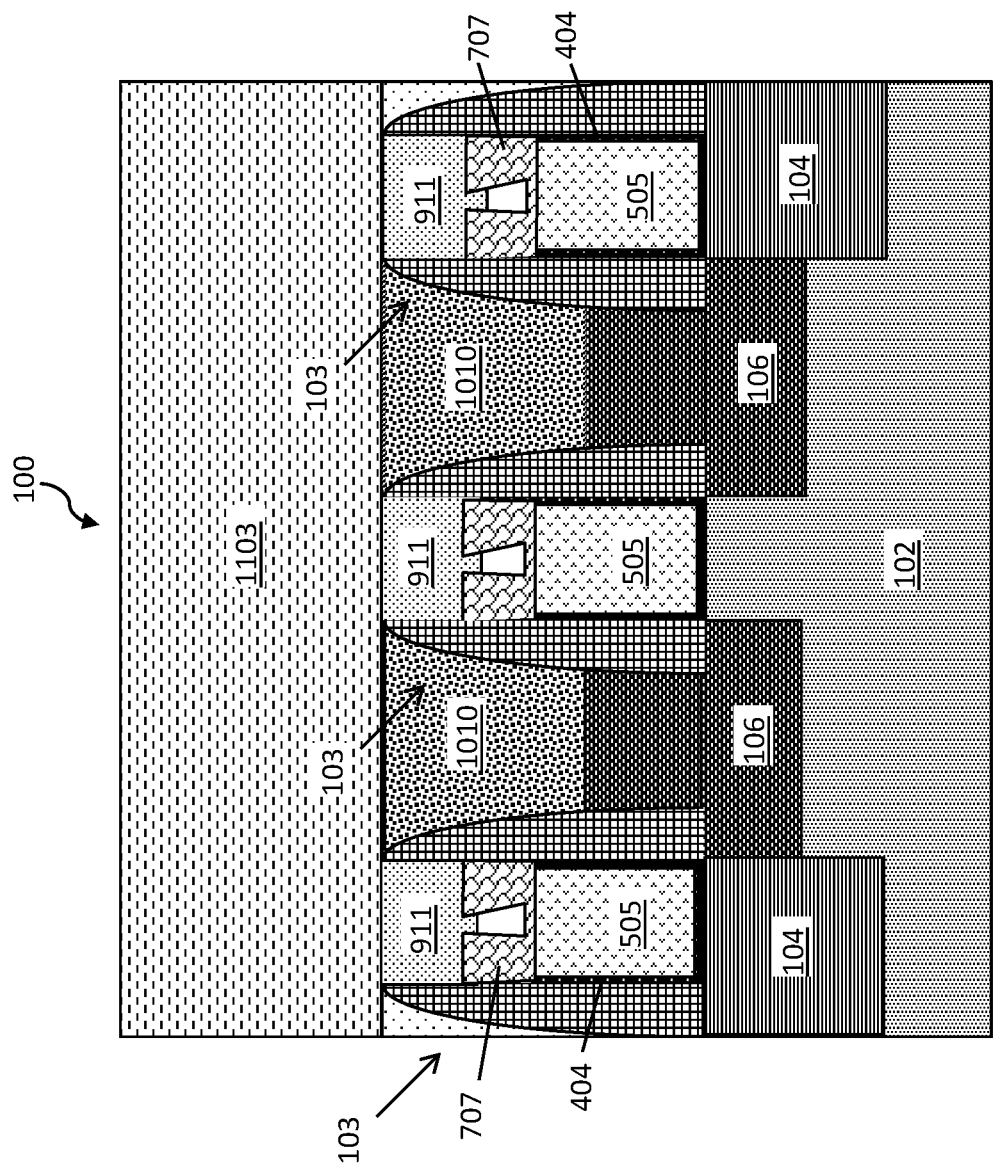

FIG. 11 depicts a cross-sectional side view of the semiconductor device 100 subsequent to depositing an ILD 1103 on the gates 103 and contacts 1010. The ILD 1103 includes a dielectric material, such as a low-k material. The dielectric material can be, but not limited to, silicon oxide, spin-on-glass, a flowable oxide, a high density plasma oxide, borophosphosilicate glass (BPSG), or any combination thereof. The dielectric material is deposited by a deposition process, including, but not limited to CVD, PVD, PECVD, ALD, evaporation, chemical solution deposition, or like processes. The ILD 202 is planarized or polished, by for example chemical mechanical planarization (CMP), to the top surface of the gates 103.

Figure 12:

FIG. 12 depicts a cross-sectional side view of the semiconductor device 100 subsequent to forming contacts 1202 in the ILD 1103. The contacts 1202 are also referred to as the second portion of the source/drain contacts. The contacts 1202 are formed by etching openings in the ILD 1103 over the source/drain regions 106. The openings are filled with one or more contact metals. Non-limiting examples of contact metals include, but are not limited to, aluminum (Al), platinum (Pt), gold (Au), tungsten (W), titanium (Ti), or any combination thereof. The conductive metal is deposited by a suitable deposition process, for example, CVD, PECVD, PVD, plating, thermal or e-beam evaporation, or sputtering. A planarization process, for example, CMP, is performed to remove any metal from the surface of the ILD 1103.

As shown, even when the contacts 1202 are misaligned, or not perfectly aligned over the source/drain regions 106, misalignment will not cause an electrical short between the contact 1202 and the gate metal 505 because the dual hard mask cap, including the first hard mask layer 707 and the second hard mask layer 911, protect the gate metal 505. Any void that forms in the first hard mask layer 707 will be protected by the second hard mask layer 911.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:
   depositing a first hard mask layer on a recessed gate stack arranged between gate spacers, the first hard mask layer comprising a low-k dielectric, and the recessed gate stack comprising a gate metal; and
   depositing a second hard mask layer on the first hard mask layer between the gate spacers.

2. The method of claim 1, wherein the first hard mask layer and the second hard mask layer are different dielectric materials.

3. The method of claim 1 further comprising, prior to depositing the first hard mask material, removing a portion of a gate stack to form the recessed gate stack.

4. The method of claim 1, wherein the recessed gate stack further comprises a gate dielectric.

5. The method of claim 1 further comprising forming a contact in an interlayer dielectric on the second hard mask layer.

6. The method of claim 5, wherein the contact comprises a contact metal.

7. The method of claim 1, wherein a top surface of the second hard mask layer is substantially parallel to a top surface of the gate spacers.

8. A method of fabricating a semiconductor device, the method comprising:
   replacing a sacrificial gate material arranged between a pair of gate spacers with a metal gate stack;
   depositing a first hard mask layer on a recessed gate stack arranged between the pair of gate spacers, the first hard mask layer comprising a low-k dielectric; and
   depositing a second hard mask layer on the first hard mask layer between the gate spacers.

9. The method of claim 8, wherein the first hard mask layer and the second hard mask layer are different dielectric materials.

10. The method of claim 8 further comprising, prior to depositing the first hard mask material, removing a portion of the metal gate stack to form the recessed gate stack.

11. The method of claim 10, wherein the metal gate stack comprises a gate dielectric and a gate metal.

12. The method of claim 8 further comprising forming a contact in an interlayer dielectric on the second hard mask layer.

13. The method of claim 12, wherein the contact comprises a contact metal.

14. A semiconductor device comprising:
   a first hard mask layer arranged on a recessed gate stack, the first hard mask layer comprising a low-k dielectric;
   a second hard mask layer arranged on the first hard mask layer; and
   a pair of gate spacers arranged on sidewalls of the recessed gate stack, the first hard mask layer, and the second hard mask layer.

15. The semiconductor device of claim 14, wherein the first hard mask layer and the second hard mask layer are different dielectric materials.

16. The semiconductor device of claim 14, wherein the recessed gate stack comprises a gate dielectric and a gate metal.

17. The semiconductor device of claim 14 further comprising a contact in an interlayer dielectric arranged on the second hard mask layer.

18. The semiconductor device of claim 17, wherein the contact is arranged in contact with the second hard mask layer.

19. The semiconductor device of claim 14, wherein a top surface of the second hard mask layer is substantially parallel to a top surface of the gate spacers.

* * * * *